(12) United States Patent
Lee et al.

(10) Patent No.: US 9,524,757 B2
(45) Date of Patent: Dec. 20, 2016

(54) DATA STORAGE DEVICE CAPABLE OF REDUCING POWER CONSUMPTION

(71) Applicant: SK hynix Inc., Gyeonggi-do (KR)

(72) Inventors: Hyun Ju Lee, Gyeonggi-do (KR); Chun Sung Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/280,085

(22) Filed: May 16, 2014

(65) Prior Publication Data

US 2015/0248938 A1    Sep. 3, 2015

(30) Foreign Application Priority Data

Feb. 28, 2014  (KR) .................. 10-2014-0024070

(51) Int. Cl.
*G11C 5/14* (2006.01)
*G11C 13/00* (2006.01)
*G11C 11/22* (2006.01)
*G11C 11/16* (2006.01)

(52) U.S. Cl.
CPC ............ *G11C 5/147* (2013.01); *G11C 11/1697* (2013.01); *G11C 11/2297* (2013.01); *G11C 13/0038* (2013.01)

(58) Field of Classification Search
CPC . G11C 5/147; G11C 13/0038; G11C 11/2297; G11C 11/1697
See application file for complete search history.

(56) References Cited

U.S. PATENT DOCUMENTS

| | | | |
|---|---|---|---|
| 7,023,726 B1 * | 4/2006 | Chen et al. .................... | 365/158 |
| 7,440,354 B2 * | 10/2008 | Liston et al. .................. | 365/227 |
| 7,688,666 B2 * | 3/2010 | Choi et al. .................... | 365/226 |
| 8,018,771 B2 * | 9/2011 | Maccarrone et al. ... | 365/185.17 |
| 8,027,221 B2 * | 9/2011 | Abe et al. .................. | 365/233.1 |
| 2008/0198657 A1 * | 8/2008 | Kim et al. ............... | 365/185.18 |
| 2009/0238021 A1 * | 9/2009 | Ban .......................... | G11C 7/22 365/222 |
| 2014/0313846 A1 * | 10/2014 | Koo ......................... | G11C 5/14 365/230.06 |

FOREIGN PATENT DOCUMENTS

KR    1020000008581    2/2000

* cited by examiner

*Primary Examiner* — Vanthu Nguyen
(74) *Attorney, Agent, or Firm* — IP & T Group LLP

(57) ABSTRACT

A data storage device that includes a nonvolatile memory device, a controller suitable for controlling the nonvolatile memory device and for reading and writing data to the nonvolatile memory device, and a power management unit suitable for supplying power to the nonvolatile memory device. The controller may control the power management unit to adjust the power supplied to the nonvolatile memory device.

11 Claims, 5 Drawing Sheets

DATA STORAGE DEVICE CAPABLE OF
REDUCING POWER CONSUMPTION

CROSS-REFERENCES TO RELATED APPLICATION

The present application claims priority under 35 U.S.C. §119(a) to Korean application number 10-2014-0024070, filed on Feb. 28, 2014, in the Korean Intellectual Property Office, which is incorporated herein by reference in its entirety.

BACKGROUND

1. Technical Field

Various embodiments relate to a data storage device.

2. Related Art

Recently, the paradigm for computer surroundings has changed to ubiquitous computing where computer systems may be used anytime, anywhere. The use of portable electronic devices such as mobile phones, digital cameras, and laptop computers has rapidly increased. In general, such portable electronic devices use a data storage device including a memory device. The data storage device stores data, which is then used in the portable electronic device.

Since data storage devices using memory devices have no moving parts, the data storage device may have excellent stability and durability. Furthermore, the data storage device may have high access speeds and low power consumption. Data storage devices having such advantages may include a universal serial bus (USB) memory device, a memory card having various interfaces, a universal flash storage UFS device, and a solid-state drive (SSD).

SUMMARY

Various embodiments of the present invention are directed to a data storage device capable of reducing power consumption.

In an embodiment of the present invention a data storage device may include a nonvolatile memory device; a controller suitable for controlling, storing data, and reading data in the nonvolatile memory device; and a power management unit suitable for supplying power to the nonvolatile memory device. The controller may control the power management unit to adjust the power supplied to the nonvolatile memory device.

In an embodiment of the present invention, a data storage device may include a nonvolatile memory device, a power management unit suitable for providing driving power to the nonvolatile memory device, and a controller suitable for determining whether data to be processed through the nonvolatile memory device is sequential data or random data, and controlling the power management unit to adjust the power supplied.

In an embodiment of the present invention, a data storage device may include a nonvolatile memory device, a controller suitable for controlling the nonvolatile memory device, and a power management unit suitable for supplying power to the nonvolatile memory device. The power management unit may adjust the power supplied to the nonvolatile memory device in response to control of the controller.

BRIEF DESCRIPTION OF THE DRAWINGS

Features, aspects, and embodiments are described in conjunction with the attached drawings, in which.

DETAILED DESCRIPTION

Figure 1:
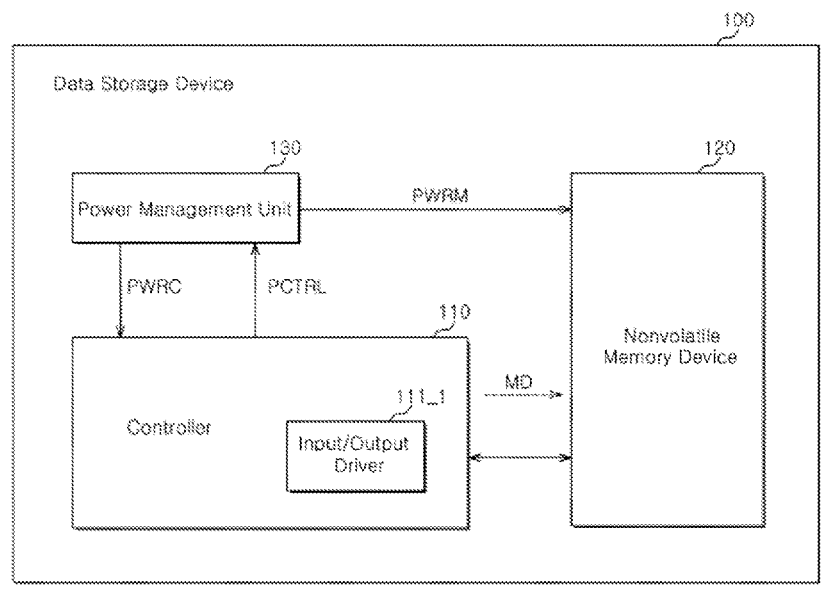
FIG. 1 is a block diagram illustrating a data storage device according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Throughout the disclosure, reference numerals correspond directly to like numbered parts in the various figures and embodiments of the present invention. The drawings are not necessarily to scale and, in some instances, proportions may have been exaggerated in order to dearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form, and vice versa, as long as it is not specifically mentioned. Furthermore, 'include/comprise' or 'including/comprising' used in the specification represents that one or more components, steps, operations, and elements exists or are added.

Hereafter, embodiments of the present invention will be described with reference to the drawings.

FIG. 1 is a block diagram illustrating a data storage device according to an embodiment of the present invention. The data storage device 100 may store data, which is accessed by a host device (not shown), such as a mobile phone, an MP3 player, a laptop computer, a desktop computer, a game player, a TV, or an in-vehicle infotainment system. The data storage device 100 may be referred to as a memory system.

The data storage device 100 may be fabricated as any one of various types of storage devices according to an interface protocol coupled to the host device. For example, the data storage device 100 may be implemented with any one of various types of storage devices such as a solid-state drive (SSD), a multi-media card in the form of a MMC, an eMMC, a RS-MMC, a MMC-micro, a secure digital card in the form of an SD, a Mini-SD, or a Micro-SD, a universal storage bus (USB) device, a universal flash storage (UFS) device, a personal computer memory card international association (PCMCIA) card-type storage device, a peripheral component interconnection (PCI) card-type storage device, a PCI express (PCI-E) card-type storage device, a compact flash (CF) card, a smart media card, and a memory stick.

The data storage device 100 may be fabricated in one of various types of packages. For example, the data storage device 100 may be implemented with packages such as a package on package (POP), a system in package (SIP), a system on chip (SOC), a multi-chip package (MCP), a chip on board (COB), a wafer-level fabricated package (WFP), and a wafer-level stack package (WSP).

The data storage device 100 may include a controller 110, a nonvolatile memory device 120, and a power management unit 130. Although not shown, the data storage device 100 may further include a volatile memory device capable of buffering or caching data, which is to be transmitted from the host device to the nonvolatile memory device 120 or from the nonvolatile memory device 120 to the host device.

The controller 110 may control overall operations of the data storage device 100 by driving firmware or software loaded in an internal working memory device (not shown). The controller 110 may decode and drive a code instruction or algorithm such as firmware or software. The controller 110 may be implemented in hardware or a combination of hardware and software. The controller 110 may include a micro control unit (MCU), a central processing unit (CPU) or the like.

The controller 110 may control the nonvolatile memory device 120. For example, the controller 110 may control the nonvolatile memory device 120 to perform a read, write, or erase operation. Furthermore, the controller 110 may control an operation mode MD such that the nonvolatile memory device 120 operates in a low speed mode or a high speed mode.

The controller 110 may include an input/output driver 111_1. The input/output driver 111_1 may drive control signals to be provided to the nonvolatile memory device 120. The input/output driver 111_1 may drive data signals to be provided to the nonvolatile memory device 120. Furthermore, the input/output driver 111_1 may receive data signals or state signals from the nonvolatile memory device 120.

The nonvolatile memory device 120 may operate as a storage medium of the data storage device 100. The nonvolatile memory device 120 may be implemented with any one of various nonvolatile memory devices such as a NAND flash memory device, a NOR flash memory device, a ferroelectric random access memory (FRAM) using a ferroelectric capacitor, a magnetic random access memory using a tunneling magneto-resistive (TMR) layer, a phase change random access memory (PCRAM) using a chalcogenide alloy, and a resistive random access memory (RERAM) using transition metal oxide. The FRAM, MRAM, PCRAM, and RERAM are nonvolatile random access memory devices in which memory cells may be randomly accessed. The nonvolatile memory device 120 may be implemented with a combination of a NAND flash memory device and the above-described nonvolatile random access memory devices.

The power management unit 130 may supply power to internal function blocks of the data storage device 100, such as the controller 110 and the nonvolatile memory device 120. For example, the power management unit 130 may generate controller power PWRC based on source power inputted from an external device, and supply the generated controller power PWRC to the controller 110. The power management unit 130 may generate memory power PWRM based on source power inputted from an external device, and supply the generated memory power PWRM to the nonvolatile memory device 120. The power management unit 130 may generate the memory power PWRM to be supplied to the nonvolatile memory device 120, based on a power control signal PCTRL provided from the controller 110.

The controller 110 may determine the properties of a work, which is to be processed by the controller 110, based on the attributes of an operation requested from the host device or the attributes of data requested from the host device. The controller 110 may dynamically vary power PWRM supplied to the nonvolatile memory device 120, based on the properties of the work to be processed. When the power PWRM supplied to the nonvolatile memory device 120 is dynamically varied, unnecessary power consumption may be reduced. Thus, the power consumption of the data storage device 100 may be reduced.

The controller 110 may provide the power control signal PCTRL to the power management unit 130 based on the properties of the work to be processed. The controller 110 may control the operation mode MD of the nonvolatile memory device 120 based on the properties of the work to be processed. That is, the controller 110 may set the operation mode MD of the nonvolatile memory device 120 such that the nonvolatile memory device 120 operates in an operation mode corresponding to the memory power PWRM supplied to the nonvolatile memory device 120. Furthermore, the controller 110 may set a driving voltage level of the input/output driver 111_1 corresponding to the set operation mode of the nonvolatile memory device 120.

The controller 110 may determine whether data to be processed through the nonvolatile memory device 120, that is, data to be written to the nonvolatile memory device 120 or data to be read from the nonvolatile memory device 120, is sequential data or random data. The controller 110 may control the power management unit 130 to adjust the power, for example, having different voltage levels, to the nonvolatile memory device 120 depending on the determination of whether the data to be processed is sequential or random data (the determination result).

Figure 2:
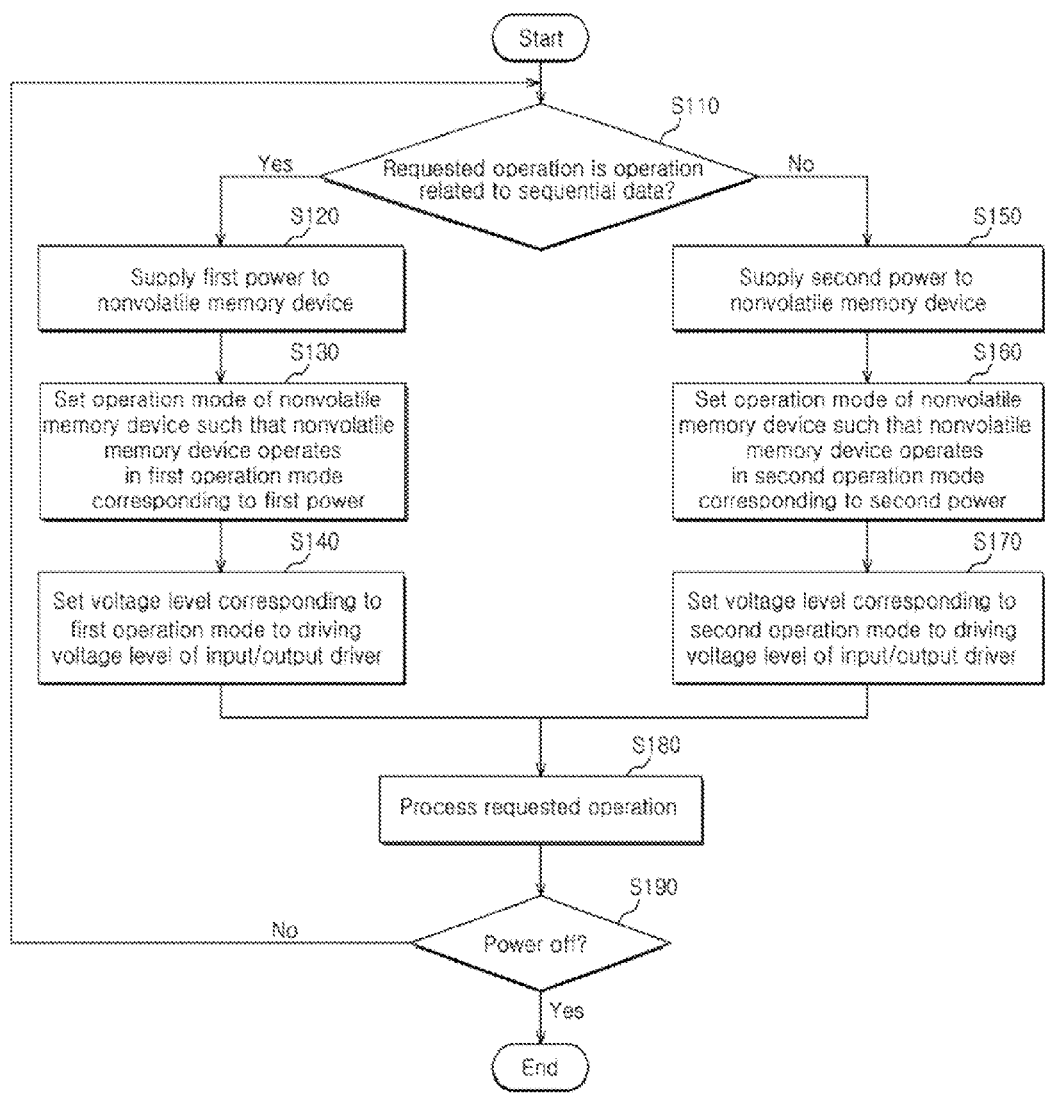
FIG. 2 is a flowchart for explaining an operating method of the data storage device according to the embodiment of the present invention.

FIG. 2 is a flowchart for explaining an operating method of the data storage device according to the embodiment of the present invention. Referring to FIGS. 1 and 2, the operation of the data storage device will be described in detail.

At step S110, the controller 110 may determine whether an operation related to sequential data is requested from the host device based on the properties of the work to be processed. For example, the controller 110 may receive the attribute information of the requested operation from the host device and determine the properties of the work to be processed based on the attribute information of the requested operation. Further, the controller 110 may determine the attribute information of data requested from the host device based on address mapping information, and determine the properties of the work to be processed according to the determination result. The address mapping information may include address mapping information of the nonvolatile memory device 120 on an address of the host device, which is to be referred to in order to process the data requested from the host device through the nonvolatile memory device 120, that is, in order to store the data in the nonvolatile memory device 120 or read the data from the nonvolatile memory device 120.

When the operation related to sequential data is requested from the host device, the procedure may proceed to step S120.

At step S120 the controller 110 may supply first power to the nonvolatile memory device 120. That is, the controller 110 may provide the power control signal PCTRL to the power management unit 130 to supply the first power to the nonvolatile memory device 120. Furthermore, the power management unit 130 may generate first power based on the power control signal PCTRL, and supply the generated first power as memory power PWRM to the nonvolatile memory device 120.

The first power, which is supplied to the nonvolatile memory device 120 when the operation related to sequential data is requested, may have a first voltage level.

At step S130, the controller 110 may set the operation mode MD of the nonvolatile memory device 120 such that the nonvolatile memory device 120 operates in a first operation mode corresponding to the first power. The first operation mode may include a high-speed mode. The first operation mode may include a double data rate (DDR) mode in which data is captured at rising and falling edges of a data strobe signal. When the operation mode is changed according to the control of the controller 110, the nonvolatile memory device 120 may be reset or operate in the set operation mode until the operation mode is changed to another operation mode.

At step S140, the controller 110 may set the voltage level corresponding to the first operation mode to a driving voltage level of the input/output driver 111_1. That is, the controller 110 may set the driving voltage level of the input/output driver 111_1 to a second voltage level corresponding to the first operation mode such that the levels of signals transmitted and received between the input/output driver 111_1 and the nonvolatile memory device 120 operating in the first operation mode are matched.

On the other hand, when the operation related to sequential data is not requested from the host device, that is, when the operation related to random data is requested from the host device, the procedure may proceed to step S150.

At step S150 the controller 110 may supply second power to the nonvolatile memory device 120. That is, the controller 110 may provide the power control signal PCTRL to the power management unit 130 to supply the second power to the nonvolatile memory device 120. The power management unit 130 may generate the second power based on the power control signal PCTRL, and supply the generated second power as memory power PWRM to the nonvolatile memory device 120.

The second power, which is supplied to the nonvolatile memory device 120 when an operation related to random data is requested, may have a third voltage level. The third voltage level may be lower than the first voltage level of the first power supplied to the nonvolatile memory device 120 when an operation related to sequential data is requested.

At step S160, the controller 110 may set the operation mode MD of the nonvolatile memory device 120 such that the nonvolatile memory device 120 operates in a second operation mode corresponding to the second power. The second operation mode may include a low-speed mode. The second operation mode may include a single data rate (SDR) mode in which the data strobe signal is not used. When the operation mode is changed according to the control of the controller 110, the nonvolatile memory device 120 may be reset or operate in the set operation mode until the operation mode is changed to another operation mode.

At step S170, the controller 110 may set a voltage level corresponding to the second operation mode to the driving voltage level of the input/output driver 111_1. Namely, the controller 110 may set the driving voltage level of the input/output driver 111_1 to a fourth voltage level corresponding to the second operation mode such that the levels of signals transmitted and received between the input/output driver 111_1 and the nonvolatile memory device 120 operating in the second operation mode are matched.

The fourth voltage level corresponding to the second operation mode may be higher than the second voltage level corresponding to the first operation mode.

At step S180 after step S140 or S170, the controller 110 may perform the requested operation, that is, the work to be processed by the controller 170.

At step S190, the controller 190 may determine whether the data storage device 110 enters a power-off state. When the data storage device 110 does not enter the power-off state, the procedure may proceed to step S110. On the other hand, when the data storage device 110 enters the power-off state, the procedure may be ended. That is, the controller 110 may dynamically vary the memory power PWRM supplied to the nonvolatile memory device 120 based on the properties of the work to be processed, and process the requested operation, until the operation of the data storage device 100 is ended.

Figure 3:
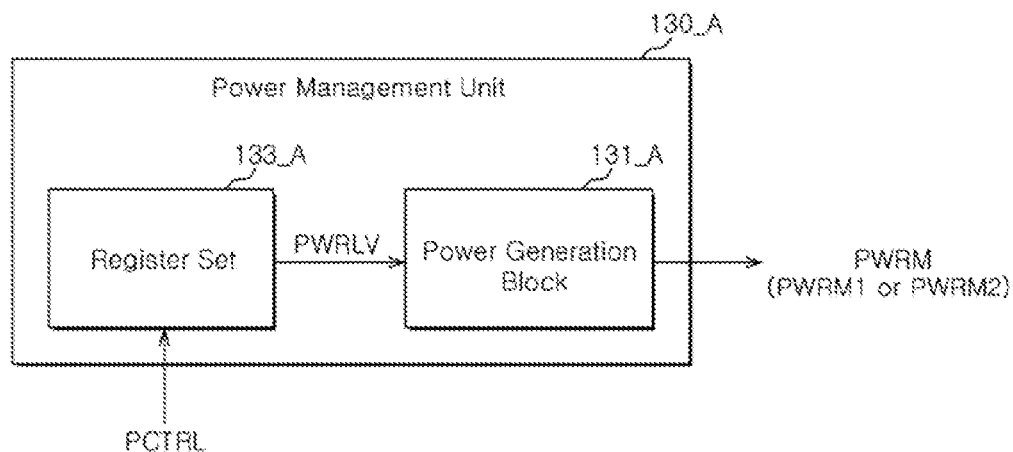
FIGS. 3 and 4 are detailed diagrams of a power management unit shown in FIG. 1.

FIG. 3 is detailed diagram of the power management unit shown in FIG. 1. Referring to FIG. 3, the power management unit 130_A may include a power generation block 131_A and a register set 133_A.

The controller 110 of FIG. 1 may provide the voltage level of the memory power PWRM, which is to be supplied to the nonvolatile memory device 120, as the power control signal PCTRL to the power management unit 130_A. In this case, the register set 133_A may store the power management signal PCTRL provided from the controller 110.

The power generation block 131_A may generate the memory power PWRM by referring to the voltage level of the memory power PWRM stored in the register set 133_A, and supply the generated memory power PWRM to the nonvolatile memory device 120. For example, when the voltage level of the first power PWRM1 is provided as the power control signal PCTRL, the power generation block 131_A may generate first power PWRM1, and supply the generated first power PWRM1 to the nonvolatile memory device 120. For another example, when the voltage level of the second power PWRM2 is provided as the power control signal PCTRL, the power generation block 131_A may generate the second power PWRM2, and supply the generated second power PWRM2 to the nonvolatile memory device 120.

That is, when the power control signal PCTRL, which directly indicates the voltage level of the memory power PWRM to be supplied to the nonvolatile memory device 120, is provided from the controller 110, the power management unit 130_A may generate the memory power PWRM corresponding to the power control signal PCTRL, and supply the generated memory power PWRM to the nonvolatile memory device 120.

Figure 4:
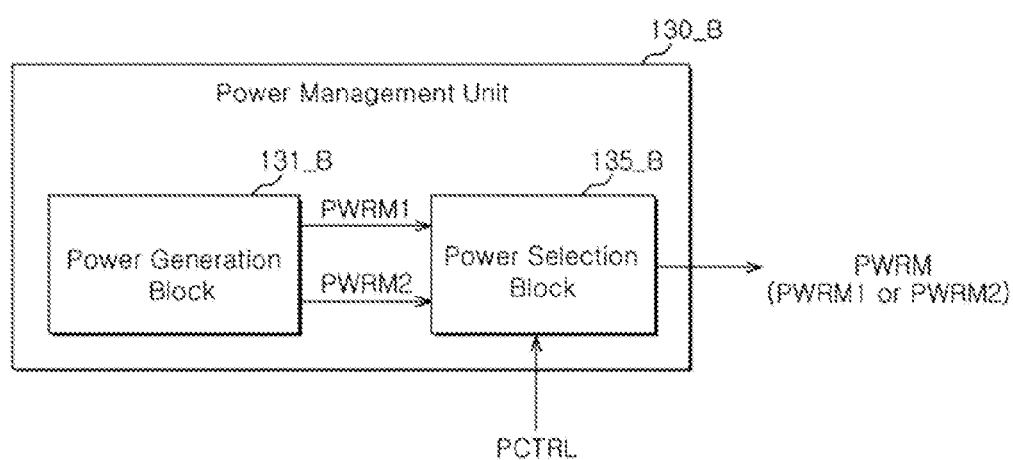

FIG. 4 is a detailed diagram of a power management unit shown in FIG. 1. Referring to FIG. 4, the power management unit 130_B may include a power generation block 131_B and a voltage selection block 135_B.

The power generation block 131_B may generate first and second powers PWRM1 and PWRM2 as the memory power PRWM. The first and second powers PWRM1 and PWRM2 generated through the power generation block 131_B may be provided to the power selection block 135_B.

The power selection block 135_B may select any one of the first and second powers PWRM1 and PWRM2 in response to the power control signal PCTRL provided from the controller 110 of FIG. 1, and supply the selected power as the memory power PWRM to the nonvolatile memory device 120.

Figure 5:
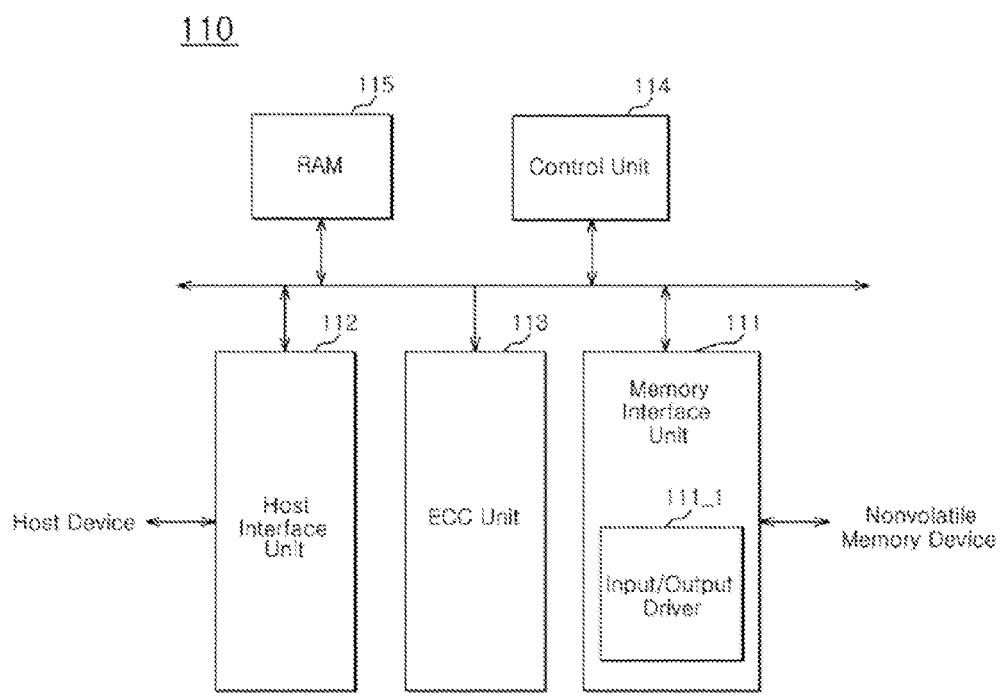
FIG. 5 is a block diagram illustrating a controller according to the embodiment of the present invention.

FIG. 5 is a block diagram illustrating the controller according to the embodiment of the present invention.

Referring to FIG. 5, the controller may include a memory interface unit 111, a host interface unit 112, an error correction code (ECC) unit 113, a control unit 114, and a RAM 115.

The memory interface unit 111 may provide a command and address to the nonvolatile memory device of FIG. 1. Furthermore, the memory interface unit 111 may exchange data with the nonvolatile memory device 120. For this operation, the memory interface unit 111 may include an input/output driver 111_1.

The host interface unit 112 may interface a host device and the data storage device 100 of FIG. 1 in response to a protocol of the host device. For example, the host interface unit 112 may communicate with the host device through any one of a USB protocol, a UFS protocol, a multimedia card (MMC) protocol, a parallel advanced technology attachment (PATA) protocol, a serial advanced technology attachment (SATA) protocol, a small computer system interface (SCSI) protocol, a peripheral component interconnection (PCI) protocol, and a PCI-express (PCI-E) protocol. Furthermore, the host interface unit 112 may perform a disk emulation function of supporting the host device to recognize the data storage device 100 as a hard disk drive (HDD).

The ECC unit 113 may generate a parity bit based on data transmitted to the nonvolatile memory device 120. The generated parity bit may be stored in a spare area of the nonvolatile memory 120. The ECC unit 113 may detect errors of data read from the nonvolatile memory device 120. When the number of detected errors falls within a correction range, the ECC unit 113 may correct the detected errors.

The control unit 114 may analyze and process a signal inputted from the host device. The control unit 114 may control overall operations of the controller 110 in response to a request of the host device. The control unit 114 may control operations of function blocks of the data storage device 110 according to firmware or software for driving the data storage device 100. The RAM 115 may be used as a working memory device for driving the firmware or software.

Figure 6:
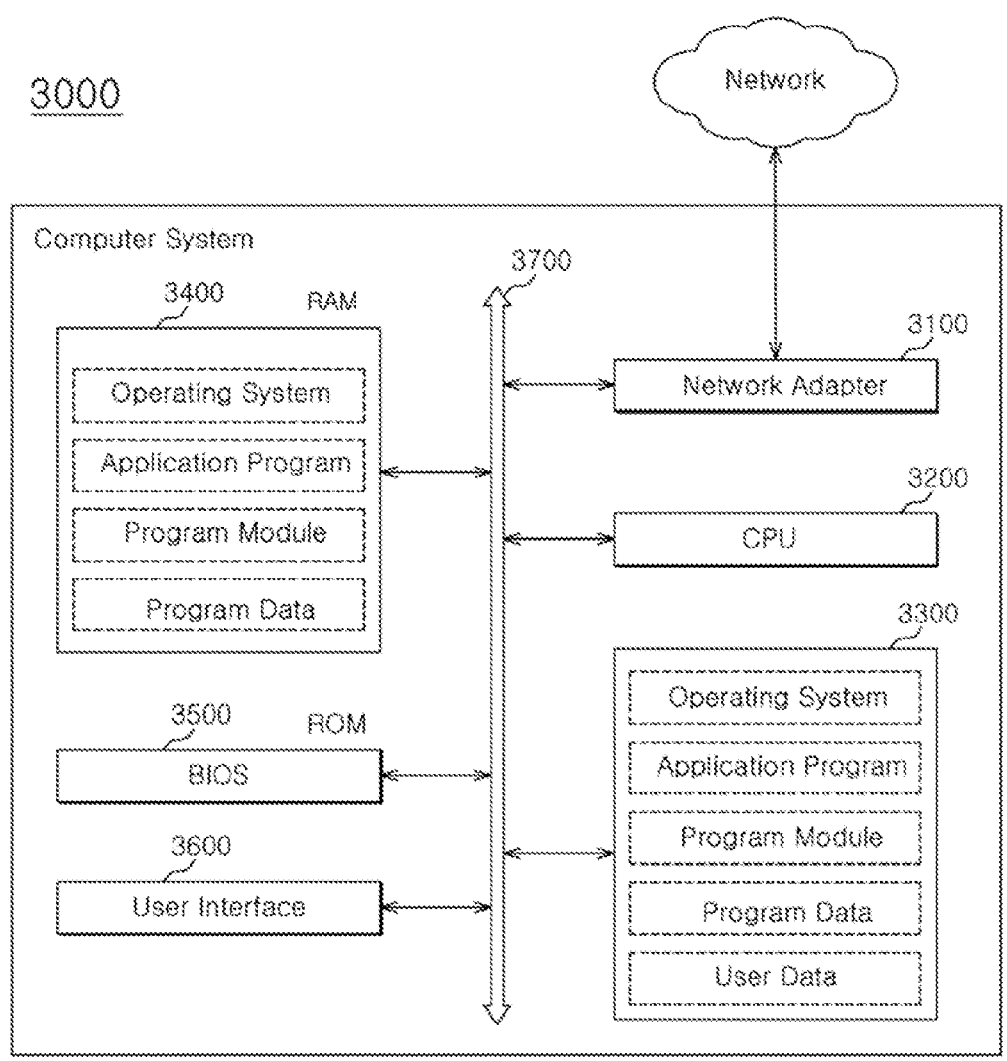
FIG. 6 is a block diagram illustrating a computer system in which the data storage device in accordance with the embodiment of the present invention is mounted.

FIG. 6 is a block diagram illustrating a computer system in which the data storage device in accordance with the embodiment of the present invention is mounted. Referring to FIG. 6, the computer system 3000 may include a network adapter 3100, a CPU 3200, a data storage device 3300, a RAM 3400, a ROM 3500, and a user interface 3600, which are electrically coupled to a system bus 3700. The data storage device 3300 may include the data storage device 120 illustrated in FIG. 1.

The network adapter 3100 may interface the computer system 3000 and external networks. The CPU 3200 may perform overall arithmetic operations for driving an operating system or application programs staying in the RAM 3400.

The data storage device 3300 may store overall data required by the computer system 3000. For example, the operating system for driving the computer system 3000, application programs, various program modules, program data, and user data may be stored in the data storage device 3300.

The RAM 3400 may be used as a working memory device of the computer system 3000. During booting, the operating system, application programs, and various program modules, which are read from the data storage device 3300, and program data required for driving the programs may be loaded into the RAM 3400.

The ROM 3500 may store a basic input/output system (BIOS), which is enabled before the operating system is driven.

Through the user interface 3600, information exchange may be performed between the computer system 3000 and a user.

Although not shown in the drawing, the computer system 3000 may further include a battery, an application chipset, a camera image processor (CIP) and the like.

According to the embodiments of the present invention, the power consumption of the data storage device may be reduced.

While certain embodiments of the present invention have been described above, it will be understood to those skilled in the art that the embodiments of the present invention described are for example only. Accordingly, the data storage device described herein should not be limited based on the described embodiments of the present invention. Rather, the data storage device described herein should be limited only in light of the claims that follow when taken in conjunction with the above description and accompanying drawings.

What is claimed is:

1. A data storage device comprising:
    a nonvolatile memory device;
    a controller suitable for reading data from and writing data to the nonvolatile memory device, wherein the controller comprises an input/output driver suitable for driving a control signal or data signal to be provided to the nonvolatile memory device; and
    a power management unit suitable for supplying power to the nonvolatile memory device,
    wherein the controller determines whether an operation related to sequential data or random data is requested, and controls the power management unit to adjust the power supplied to the nonvolatile memory device according to the determination result,
    wherein the controller sets a second voltage level corresponding to the first operation mode as a driving voltage level of the input/output driver,
    wherein the controller controls the power management unit to supply first power having a first voltage level to the nonvolatile memory device when the operation related to the sequential data is requested,
    wherein the controller sets an operation mode of the nonvolatile memory device such that the nonvolatile memory device operates in a first operation mode corresponding to the first power, and
    wherein the controller controls the power management unit to supply second power having a third voltage level lower than the first voltage level to the nonvolatile memory device when the operation related to random data is requested.

2. The data storage device according to claim 1, wherein the first operation mode includes a high-speed mode.

3. The data storage device according to claim 1, wherein the first operation mode includes a double data rate (DDR) mode using a data strobe signal.

4. The data storage device according to claim 1, wherein the controller sets the operation mode of the nonvolatile memory device such that the nonvolatile memory device operates in a second operation mode corresponding to the second power.

5. The data storage device according to claim 4, wherein the controller comprises an input/output driver suitable for driving a control signal or data signal to be provided to the nonvolatile memory device, and the controller sets a fourth voltage level, which is higher than the second voltage level, as the driving voltage level of the input/output driver, the fourth voltage level corresponding to the second operation mode.

6. The data storage device according to claim 5, wherein the second operation mode includes a low-speed mode.

7. The data storage device according to claim 5, wherein the second operation mode includes a single data rate (SDR) mode.

8. The data storage device according to claim 1, wherein the controller receives attribute information of the requested operation from a host device, and controls the power management unit based on the attribute information of the requested operation.

9. The data storage device according to claim 1, wherein the controller determines attribute information of data requested for access from a host device based on address mapping information, which is referred to in order to process the data requested from the host device through the nonvolatile memory device, and the controller controls the power management unit based on the attribute information of the data.

10. A data storage device comprising:
a nonvolatile memory device;
a power management unit suitable for providing driving power to the nonvolatile memory device; and
a controller suitable for controlling the nonvolatile memory device, wherein the controller comprises an input/output driver suitable for driving a control signal or data signal to be provided to the nonvolatile memory device,
wherein the controller determines whether data to be processed through the nonvolatile memory device is sequential data or random data, and controlling the power management unit to adjust the power depending on the determination result,
wherein the controller sets a voltage level corresponding to the first operation mode to a driving voltage level of the input/output driver when the operation mode of the nonvolatile memory device is set to the first operation mode, and sets a voltage level, which corresponds to the second operation mode and is higher than the voltage level corresponding to the first operation mode, to the driving voltage level of the input/output driver when the operation mode of the nonvolatile memory device is set to the second operation mode,
wherein the controller controls the power management unit to apply first power when the data to be processed through the nonvolatile memory device is sequential data, and the controller controls the power management unit to apply second power when the data to be processed through the nonvolatile memory device is random data, and
wherein the controller sets the operation mode of the nonvolatile memory device such that the nonvolatile memory device operates in a first operation mode corresponding to the first power when the first power is supplied to the nonvolatile memory device, and the controller sets the operation mode of the nonvolatile memory device such that the nonvolatile memory device operates in a second operation mode corresponding to the second power when the second power is supplied to the nonvolatile memory device.

11. The data storage device according to claim 10, wherein the power management unit generates the second power having a voltage level lower than the first power according to control of the controller, and supplies any one of the generated first and second powers to the nonvolatile memory device.

* * * * *